US012245520B2

(12) United States Patent
Daughton et al.

(10) Patent No.: US 12,245,520 B2
(45) Date of Patent: *Mar. 4, 2025

(54) HALL EFFECT SENSOR WITH LOW OFFSET AND HIGH LEVEL OF STABILITY

(71) Applicant: Lake Shore Cryotronics, Inc., Westerville, OH (US)

(72) Inventors: David Daughton, Worthington, OH (US); Patrick Gleeson, Pataskala, OH (US); Bo-Kuai Lai, Dublin, OH (US); Daniel Hoy, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/515,619

(22) Filed: Nov. 21, 2023

(65) Prior Publication Data

US 2024/0099159 A1    Mar. 21, 2024

Related U.S. Application Data

(63) Continuation of application No. 18/173,874, filed on Feb. 24, 2023, now Pat. No. 11,864,470, which is a continuation of application No. 16/784,950, filed on Feb. 7, 2020, now Pat. No. 11,605,778.

(60) Provisional application No. 62/802,476, filed on Feb. 7, 2019.

(51) Int. Cl.
*H10N 52/00* (2023.01)
*H10N 52/01* (2023.01)
*H10N 52/80* (2023.01)
*H10N 52/85* (2023.01)

(52) U.S. Cl.
CPC .......... *H10N 52/101* (2023.02); *H10N 52/01* (2023.02); *H10N 52/80* (2023.02); *H10N 52/85* (2023.02)

(58) Field of Classification Search
CPC ....... H10N 52/101; H10N 52/01; H10N 52/80
See application file for complete search history.

(56) References Cited

U.S. PATENT DOCUMENTS

| | | |
|---|---|---|
| 4,912,451 A | 3/1990 | Sugiyama et al. |
| 5,442,221 A | 8/1995 | Mosser et al. |
| 5,614,754 A | 3/1997 | Inoue |
| 5,657,189 A | 8/1997 | Sandhu |
| 7,173,419 B1 | 2/2007 | Johnson et al. |
| 7,868,354 B2 | 1/2011 | Garcia et al. |

(Continued)

OTHER PUBLICATIONS

Advanced Hall Sensors Ltd, "P2A Hall Sensor" downloaded on Jan. 16, 2019 from https://www.ahsltd.com/p2a-hall-sensor, 1 page.

(Continued)

*Primary Examiner* — Jose R Diaz
(74) *Attorney, Agent, or Firm* — Calfee, Halter & Griswold LLP

(57) ABSTRACT

A magnetic field magnetic field sensor and method of making the sensor. The sensor and method of making the sensor may comprise a material or structure that prevents the admission of light in certain wavelengths to enhance the stability of the magnetic field sensor over a period of time. The sensor and method of making the sensor may comprise an adsorption prevention layer which protects the semiconductor portion of the magnetic. The sensor may also comprise an insulating layer formed between semiconductor layers and a substrate layer.

20 Claims, 14 Drawing Sheets

(56) References Cited

U.S. PATENT DOCUMENTS

| | | | |
|---|---|---|---|
| 8,026,718 | B2 | 9/2011 | Miyoshi et al. |
| 8,629,539 | B2 | 1/2014 | Milano et al. |
| 10,073,151 | B2 | 9/2018 | Lindemuth |
| 10,333,057 | B2 | 6/2019 | Shoji et al. |
| 10,407,716 | B2 | 9/2019 | Brown et al. |
| 11,067,643 | B2 | 7/2021 | Schott et al. |
| 11,605,778 | B2 | 3/2023 | Daughton et al. |
| 11,864,470 | B2 * | 1/2024 | Daughton .............. H10N 50/85 |
| 2003/0164530 | A1 | 9/2003 | Jean-Louis et al. |
| 2009/0058411 | A1 | 3/2009 | Miyoshi et al. |
| 2011/0133732 | A1 | 6/2011 | Sauber |
| 2013/0075724 | A1 | 3/2013 | Hirler et al. |
| 2014/0266159 | A1 | 9/2014 | Heremans et al. |
| 2017/0062703 | A1 | 3/2017 | Nakagawa et al. |
| 2020/0259073 | A1 | 8/2020 | Daughton et al. |
| 2023/0217838 | A1 | 7/2023 | Daughton et al. |

OTHER PUBLICATIONS

Alpert et al., "Effect of Geometry on Sensitivity and Offset of AlGaN/GaN and InAlN/GaN Hall-effect Sensors," IEEE Sensors Journal, vol. 19, No. 10, May 15, 2019, 5 pages.

Dong et al., "High Sensitive pH Sensor Based on AllnN/GaN Heterostructure Transistor," Sensors 2018, vol. 18, No. 5, Apr. 24, 2018, 11 pages.

Jankowski et al., "Hall Sensors for Extreme Temperatures," Sensors 2011, vol. 11, No. 1, Jan. 14, 2011, 11 pages.

Koide et al., "High Temperature Hall sensors using AlGaN/GaN HEMT Structures," Asia-Pacific Interdisciplinary Research Conference 2011, Journal of Physics: Conference Series 352, 2012, 5 pages.

Tulip, "Development and Modeling of a Biosensor Platform using AlGaN/GaN HEMT Devices," A Dissertation Presented for the Doctor of Philosophy Degree, The University of Tennessee, Knoxville, Dec. 2014, 81 pages.

Notice of Allowance from U.S. Appl. No. 16/784,950 dated Apr. 7, 2022.

Office Action from U.S. Appl. No. 16/784,950 dated Jul. 29, 2022.

Notice of Allowance from U.S. Appl. No. 16/784,950 dated Nov. 10, 2022.

Office Action from U.S. Appl. No. 18/173,874 dated Aug. 3, 2023.

Notice of Allowance from U.S. Appl. No. 18/173,874 dated Sep. 5, 2023.

* cited by examiner

HALL EFFECT SENSOR WITH LOW OFFSET AND HIGH LEVEL OF STABILITY

CROSS-REFERENCE TO RELATED APPLICATIONS

This application is a continuation of U.S. patent application Ser. No. 18/173,874, filed on Feb. 24, 2023, which is a continuation of U.S. patent application Ser. No. 16/784,950, filed on Feb. 7, 2020, now U.S. Pat. No. 11,605,778, which claims priority to and all benefit of U.S. Provisional Patent Application Ser. No. 62/802,476, filed on Feb. 7, 2019, for Hall Effect Sensor With Low Offset And High Level Of Stability, the entire disclosures of which are fully incorporated herein by reference

FIELD

The general inventive concepts relate to high-precision Hall effect sensors and their methods of manufacture.

BACKGROUND

Hall effect sensing devices are used to sense a magnetic field present in a particular area. These sensors take advantage of an electric field generated when a magnetic field is applied to a finite sized semiconductor material such that the field is perpendicular to a current flowing in the semiconductor. This electric field is associated with a Hall effect voltage or Hall voltage. A detailed discussion of the Hall voltage and its characteristics were provided in U.S. Pat. No. 10,073,151 which is incorporated herein in its entirety by reference.

In an ideal instance, the measured Hall voltage is zero when no magnetic field is applied to the Hall effect sensor. However, various characteristics of the semiconductor material, as well as environmental factors often result in a small voltage being measurable when there is no magnetic field present at the sensor. This voltage will be referred to herein as an offset voltage. An offset voltage, particularly one that changes over time for various reasons, is undesirable as it leads to measurement errors that are difficult to compensate for.

SUMMARY

In an exemplary embodiment, a magnetic field sensor comprises a first low bandgap semiconductor layer comprising a first semiconductor, an intermediate bandgap semiconductor layer comprising a second semiconductor, the second semiconductor exhibiting a greater bandgap than the first semiconductor, a treatment layer applied to at least a portion of one of the first semiconductor or second semiconductor, and a substrate layer providing structural support for the magnetic field sensor, wherein the magnetic field sensor is characterized by an offset voltage absolute value less than an untreated offset voltage absolute value associated with the first low bandgap semiconductor layer, and the high bandgap semiconductor layer without the treatment layer, when the magnetic field sensor is exposed to ionic contaminants.

Features that are described and/or illustrated with respect to one embodiment may be used in the same way or in a similar way in one or more other embodiments and/or in combination with or instead of the features of the other embodiments.

The descriptions of the invention do not limit the words used in the claims in any way or the scope of the claims or invention. The words used in the claims have all of their full ordinary meanings.

BRIEF DESCRIPTION OF THE DRAWINGS

In the accompanying drawings, which are incorporated in and constitute a part of the specification, embodiments of the invention are illustrated, which, together with a general description of the invention given above, and the detailed description given below, serve to exemplify embodiments of this invention. It will be appreciated that illustrated element boundaries (e.g., boxes, groups of boxes, or other shapes) in the figures represent one embodiment of boundaries. In some embodiments, one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Figure 1:
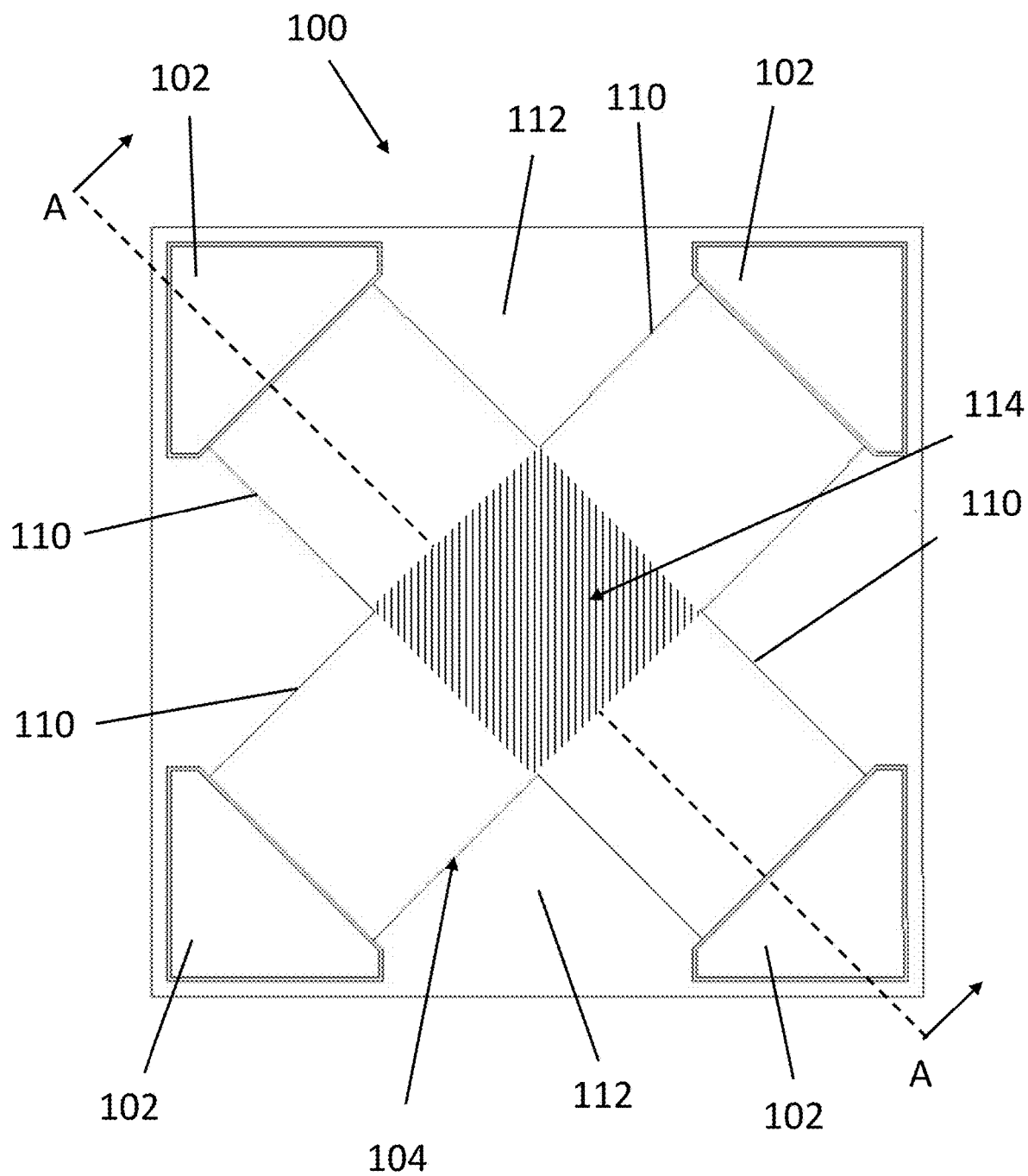
FIG. 1 is a diagram of a magnetic field sensor according to an exemplary embodiment.

The following includes definitions of exemplary terms that may be used throughout the disclosure Both singular and plural forms of all terms fall within each meaning.

III-V as used herein describes semiconductor alloys formed from elements found in group III and V in the periodic table of elements. III-N as used herein refers to compounds formed from elements of group III of the periodic table and nitrogen. Such compounds are commonly referred to as Nitride semiconductor materials. Thus, III-N semiconductors are a subset of III-V semiconductors.

2DEG as used herein refers to 2-dimensional electron gas junction which is used to form a particular type of quantum well magnetic field sensor.

Heterojunction as used herein refers to an interface between two layers or regions of dissimilar crystalline semiconductors. The term heterostructure refers to an assembly of heterojunctions.

Bandgap as used herein refers to the difference in energy between the valence band and the conduction band of an insulator or semiconductor material that consists of the range of energy values forbidden to electrons in the material. References herein to low, intermediate, high (including lower and higher) bandgaps refer to relative bandgaps and are not necessarily associated with any particular bandgap value.

While the above exemplary definitions have been provided, it is Applicant's intention that the broadest reasonable interpretation consistent with this specification be used for these and other terms.

Hall effect sensors are a type of magnetic field sensor that rely on the change in a semiconductor junction that results when a magnetic field is applied to the junction. A Hall effect sensor is driven by a current running through a pair of contact pads of a semiconductor material. In an exemplary embodiment, this pair of contact pads is an opposing pair such as the upper left contact pad and lower right contact pad (e.g., 102 of FIG. 1). The output voltage across another pair of contact terminals corresponding to a magnetic field applied across the sensor, also known as the Hall voltage, is measured. In certain exemplary embodiments, a one contact terminal from each pair of the terminals can be electrically connected such that there is a common connection for both current and voltage. In an ideal sensor, the Hall voltage should be proportional to the magnetic field applied to the semiconductor material of the sensor, though in practice several non-idealities exist. One problem with Hall effect sensors is that the Hall voltage measured when no magnetic field is applied to the device, is often non-zero and is referred to as the offset or zero-field voltage. The presence of the offset voltage is often the result of an asymmetry of current flowing through the active area of the Hall effect sensor. One factor which can cause such an asymmetric current flow is the presence of electrically charged, localized defect states in the semiconductor which forms an active area of the Hall effect sensor.

Current spinning is a technique in which the direction of the drive current is rotated around the various pairs of contact terminals that form the electrical connections to the sensor. When driven with a spinning current, Hall effect sensors exhibit an alternating output voltage. The magnitude of the alternating voltage when no magnetic field is applied to the Hall effect sensor is equivalent to an offset voltage that would be present in the Hall effect sensor to which a direct current is applied. Thus, the alternating peaks can be averaged to remove the offset voltage component a Hall sensor output voltage. Thus, the techniques described herein are applicable to configurations which use current spinning to detect offset voltage levels and also to those that do not.

Examples of semiconductor materials used in the exemplary magnetic field sensors described herein may comprise III-V materials, III-V heterostructure materials, two-dimensional electron gas (2DEG) heterostructure materials, and materials where the heterojunction comprises III-N compounds. In some embodiments, a III-N 2DEG heterostructure which may include semiconductor layers GaN/AlGaN. These materials may be used in one or more layers of a magnetic field sensor to achieve the desired magnetic field sensor properties as described below.

As is shown in FIG. 1, a top view of an exemplary magnetic field sensor 100 comprises an exemplary "X" shaped raised mesa structure 104. Located at the end of each arm 110 of the mesa structure 104 is an exposed electrical contact pad 102. The raised mesa structure 104 and electrical contact pads 102 are located on a rectangular structure 112, which extends below the mesa structure 104 and electrical contact pads 102. This raised mesa structure 104, contact pads 102, and rectangular structure 112 represents a top view of an exemplary magnetic field sensor. FIGS. 2A-2D illustrate cross section views of distinct embodiments of various magnetic field sensors where each of the distinct embodiments have top views similar to that illustrated by FIG. 1. Thus, even though the exemplary embodiments of FIGS. 2A-2D may have different layer structures, these exemplary embodiments, if viewed from the top instead of in cross-section, comprise a mesa structure 104, contact pads 102, and a rectangular structure 112. In an exemplary magnetic field sensor, the rectangular structure 112 is formed from a substrate 108, a buffer layer 212, and a portion of a low bandgap layer 204. This structure is illustrated in the cross-section view of FIG. 2B described in detail later herein. In some exemplary embodiments, each arm 110 of the mesa structure 104 is symmetrical, thus each arm 110 comprises an electrical contact pad 102. In addition to the physical arrangement of the mesa structure arms 110 as illustrated, other arrangements may be employed, including, but not limited to, arrangements that take advantage of the Van der Pauw method, Hall bar configurations, or other Hall sensor geometries. As shown in FIGS. 2A-2D below, treatment layers can be applied to the magnetic field sensor.

In the exemplary embodiment shown, the area of the raised mesa structure 104 that is located where the arms 110 cross is illustrated by the hatched area, referred to herein as the active area 114 of the sensor. However, various exemplary embodiments may be constructed that exhibit an active area that extends beyond the lined area, into the remaining raised mesa structure 104.

Magnetic field sensors can be susceptible to outside influences (for example, without limitation, ionic contaminants, visible and/or ultraviolet light, alternative magnetic fields, or mechanical damage). Exemplary embodiments comprise a protective layer to prevent these outside influences from impacting the performance of the magnetic field sensor. In some exemplary embodiments, one or more protective layers can be applied to magnetic field sensor.

One form of outside influence may be ionic contaminants. Ionic contaminants may temporarily be at the surface of a semiconductor. This is in contrast to oxidation, which implies a chemical bonding between a contaminant and the semiconductor. As used herein, the term "adsorption" may include the attachment of ionic contaminates (also referred to as adsorbates where an ionic contaminant (a particle having an electric charge or an electric dipole) is an example of an adsorbate) to or near the surface of the active area including, but not limited to, electronic bonding, Van der Waals, etc. Thus, without some means for preventing it, ionic contaminants may attach to surfaces of the raised mesa structure 104. Both physical degradation and adsorption of ionic contaminants may change the performance of a magnetic field sensor (e.g. sensitivity and offset voltage).

Figure 2A:
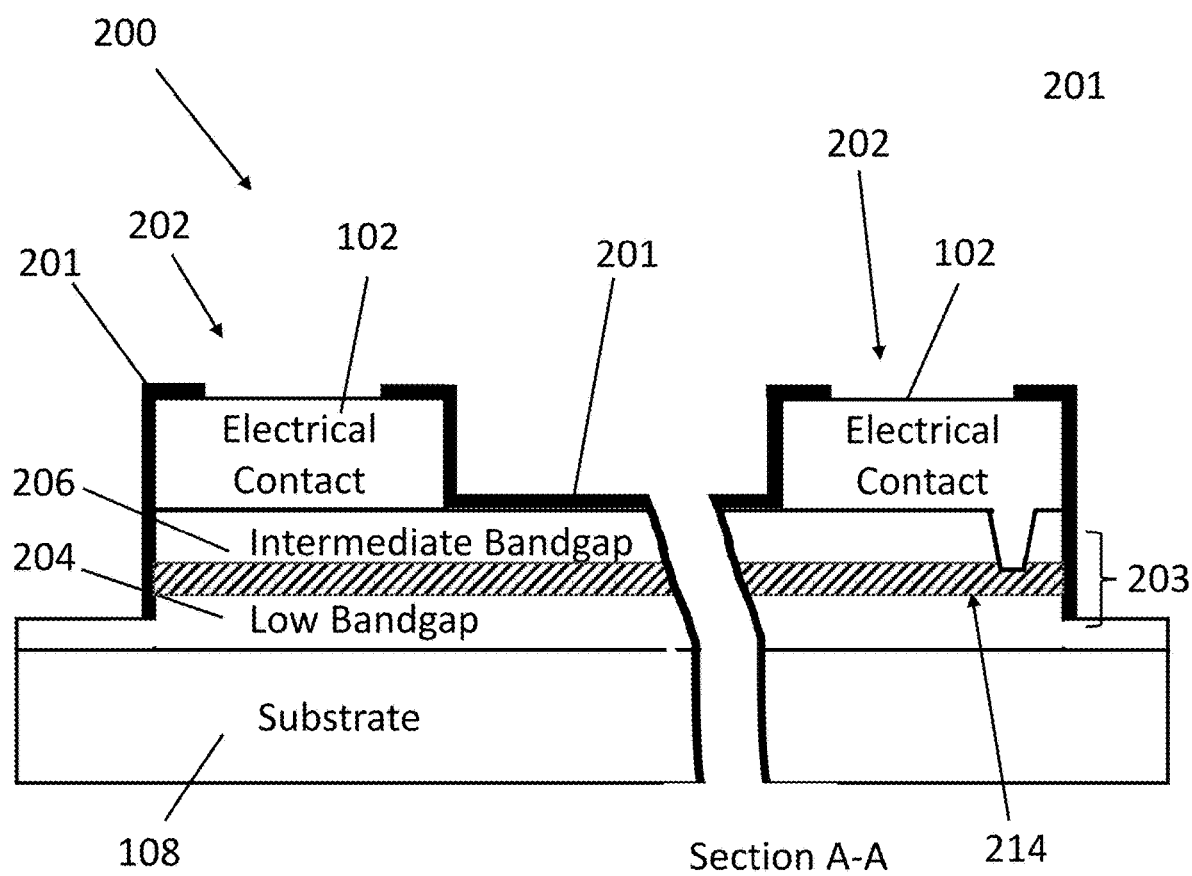
FIG. 2A is a diagram showing the cross-section of an exemplary magnetic field sensor comprising a treatment layer according to an exemplary embodiment.

FIG. 2A, illustrates a cross section 200 of an exemplary sensor 200 (which can comprise a mesa structure such as that illustrated in FIG. 1). The cross section illustrated is a cross section taken through two of the mesa arms 110 (FIG. 1 at cross section view A-A shown with a break and not drawn to scale), the magnetic field sensor may be covered with a protection layer, which in the illustrated exemplary embodiment is a treatment layer 201, for example, an adsorption prevention layer, which may be, for example, SiNx, except for windows 202 etched above each arm 110 at the electrical contact pads 102. In exemplary embodiments, the electrical contact pads 102 can comprise gold and/or titanium. The treatment layer 201 can reduce or minimize an offset voltage of the sensor by reducing the adsorption of ionic contaminants. In various embodiments, such a treatment layer can be an exemplary adsorption prevention layer or passivation layer referenced herein. It will be understood that other treatments that electrically isolate ionic contaminants from the semiconductor portion (the exemplary embodiment illustrated in FIG. 2A comprises layers 208 and 204) of the magnetic field sensor may be used in exemplary embodiments.

The operation of magnetic field sensors is affected by the total ionic charge that is present near an exemplary III-N 2DEG heterostructure portion of the magnetic field sensor. Not only the total ionic charge but also the spatial distribution of those charges is important. An asymmetric distribution of the ionic charges near a III-N 2DEG heterostructure used for a magnetic field sensor changes the distribution of current in the active area 114. This change in the distribution of the current results in an unpredictable change in the offset voltage. Additionally, the distribution of ionic charges near the III-N 2DEG heterostructure caused by adsorption is likely to change with time and with variation in the environment at the III-N 2DEG heterostructure surface. This temporal variation in the ionic adsorption distribution may cause the offset voltage to vary over time, which makes for an unstable sensor.

Figure 2B:
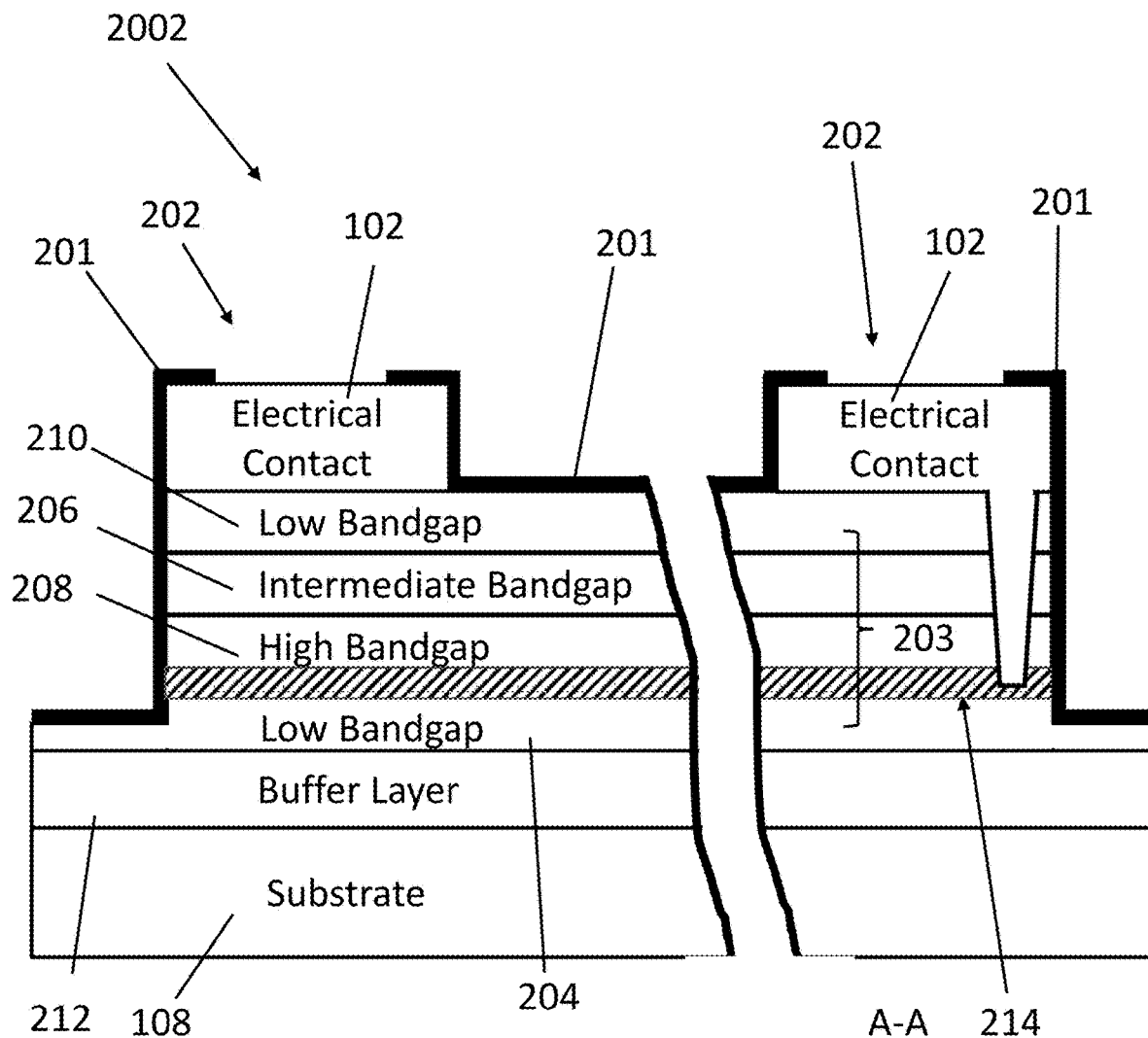
FIG. 2B is a diagram showing the cross-section of an exemplary magnetic field sensor comprising a treatment layer according to an exemplary embodiment.
Figure 2C:
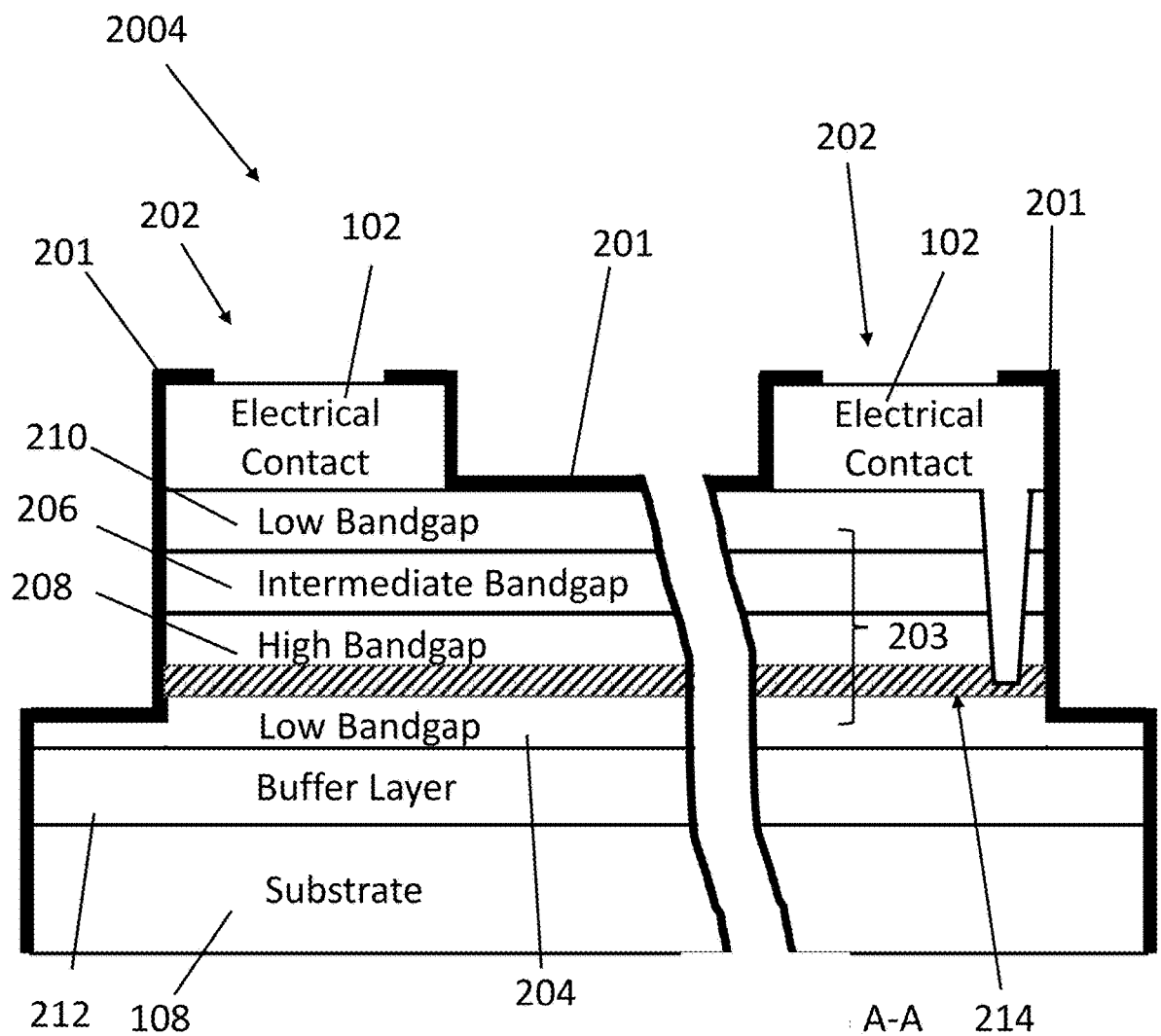
FIG. 2C is a diagram showing the cross-section of an exemplary magnetic field sensor comprising a treatment layer according to an exemplary embodiment.

Referring to FIG. 2B, in an exemplary embodiment, a magnetic field sensor 2002 comprises a III-N 2DEG heterostructure and a treatment layer 201 at the top surface of the III-N 2DEG heterostructure that can reduce or minimize an offset voltage of a magnetic field sensor which comprises the III-N 2DEG heterostructure by preventing the adsorption of surface ionic contaminants. In various embodiments, such a treatment layer can be an exemplary adsorption prevention layer or passivation layer referenced herein. It will be understood that other treatments that electrically isolate any ionic contaminants from the semiconductor portion (illustrated in FIG. 2B as the region including layers 210, 206, 208, and 204) of the magnetic field sensor may be used in exemplary embodiments. For example, in the embodiment of FIG. 1 and with further reference to FIG. 2B which illustrates a cross section 2002 of an exemplary magnetic field sensor through two of the mesa arms 110 (for example, FIG. 1 at cross section view A-A), the magnetic field sensor may be covered with a treatment layer 201, for example, an adsorption prevention layer, which may be, for example, SiNx, except for windows 202 etched above each arm 110 at the electrical contact pads 102. In such exemplary embodiments, the treatment layer 201 can thereby minimize offset voltage of the magnetic field sensor for example, by preventing at least some contaminant adsorption on the surface (layer 210 and the edge portions of layers 206, 208 and a portion of layer 204 as illustrated in FIG. 2B) of the magnetic field sensor. As illustrated in this exemplary embodiment, the treatment layer 201 extends beyond the junction between layer 208 and layer 204 where the 2DEG heterojunction 214 is located. In other exemplary embodiments, the treatment layer 201 only covers the arms 110 of the mesa structure 104 and portions of the electrical contact pads 102 (as illustrated in FIG. 2A). In other exemplary embodiments, the treatment layer 201 may extend beyond the 2DEG heterojunction 214. As illustrated in the exemplary embodiment is shown in FIG. 2C, the treatment layer 201 extends along the edges of layers 210, 206, 208, 204 and 212, to at least partially cover the substrate 108. It will be understood that the treatment layer 201 is applicable to magnetic field sensors formed from other semiconductor arrangements in addition to the magnetic field sensors comprising III-N 2DEG heterostructures described in the exemplary embodiments disclosed herein. In addition to III-N 2DEG heterostructures, other exemplary embodiments may feature III-N heterostructures that are not 2DEG structures, such as quantum wells.

Referring again to FIG. 2B, the cross section 2002 shows a stack of materials (a layer stack) comprised of layers 204-210 arranged on a buffer layer 212. In an exemplary embodiment, layers 204-210 form a III-N 2DEG heterostructure 203 which functions as a magnetic field sensor. Note that FIGS. 2A-2D illustrated various layers of exemplary cross sections, however, these layers are not shown to scale but instead are illustrated as nearly uniform in thickness. In an exemplary embodiment, a first low bandgap layer 204 may be formed from GaN, the high bandgap layer 208 layer may be formed from AlN, the intermediate bandgap layer 206 may be formed from AlGaN, and a second low bandgap layer 210 may be formed from GaN. These materials are arranged on substrate 108. Fewer layers than those illustrated may be used to form a III-N 2DEG heterostructure. For example, a III-N 2DEG heterostructure may be formed using layers 204 and 206 or 204 and 208.

In an exemplary embodiment, treatment of a magnetic field sensor comprising a III-N 2DEG heterostructure, via treatment layer 201, can protect against the adsorption of surface ionic contaminants. Passivation is one method of creating a treatment layer 201 in certain embodiments. In other exemplary embodiments, hermetically sealing the magnetic field sensor in a controlled environment serves to prevent the adsorption of ionic contaminants. For example, enclosing the magnetic field sensor in an environment such as a vacuum or an inert gas that is maintained in a sealed enclosure.

In some exemplary embodiments, the treatment layer 201 also serves to protect the sensor from physical and chemical degradation (e.g., oxidation of the top layer of a III-N structure and mechanical abrasion). Both adsorption of surface ionic contaminants and physical or chemical degradation can change the device performance (e.g., sensitivity and offset voltage). However, in exemplary embodiments, a treatment layer 201 reduces the magnitude of the offset voltage and makes the remaining offset voltage more stable. These improvements can also be realized during current spinning operations. Current spinning is described in U.S. Pat. No. 10,073,151.

Figure 2D:
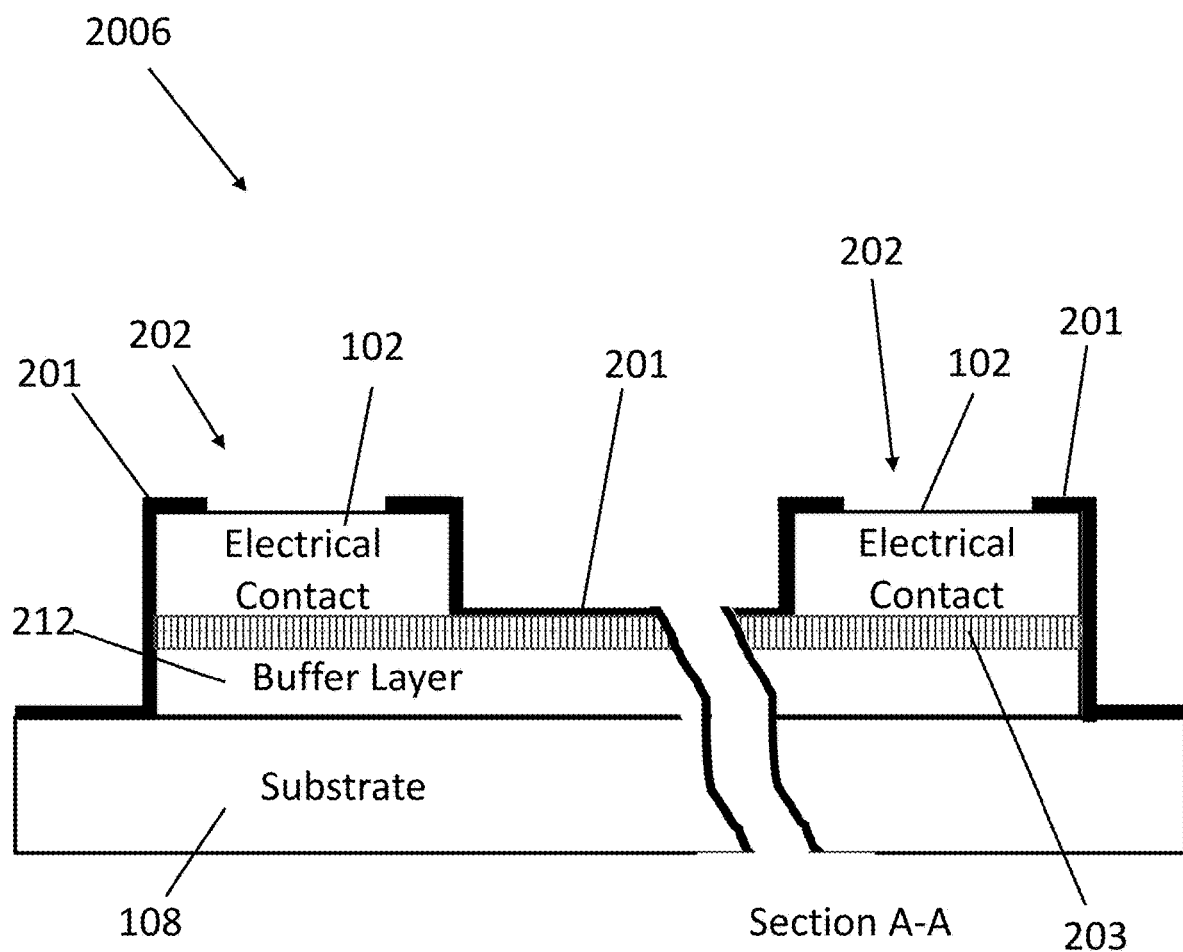
FIG. 2D is a diagram showing the cross-section of an exemplary magnetic field sensor comprising a treatment layer according to an exemplary embodiment.

In order to clearly illustrate the various layers of the various exemplary sensors, FIGS. 2A-2D are not drawn to scale. In actual practice, the III-N 2DEG heterostructure 203 is closer to what is illustrated in FIG. 2D where the III-N 2DEG heterostructure 203 is illustrated as a thick line located at the top edge of the buffer layer 212 (Note that because the layers that form the magnetic field sensor comprising a III-N 2DEG heterostructure 203 are extremely thin, this figure is still not drawn to scale). Thus, in typical magnetic field sensor comprising III-N 2DEG heterostructures, at least one face of the exterior surfaces of the magnetic field sensor is typically very close (<100 nm) to the III-N 2DEG heterostructure 203. However, in other embodiments this distance may be equal to or greater than 100 nm. Because of the small distance between the exterior surfaces of the magnetic field sensor and the III-N 2DEG heterostructure 203, adsorption of ionic contaminants onto the heterostructure surface can alter the electric field at the III-N 2DEG heterostructure 203 and meaningfully impact the magnetic field sensor's performance. A treatment layer 201 applied to or formed during the fabrication of the magnetic field sensor serves to protect the exterior surface of the heterostructure in order to minimize the adsorption of ionic contaminants. In an exemplary embodiment, the treatment layer 201 is a passivation layer formed from SiNx that is 2 nm or thicker has the effect of electrically isolating the III-N 2DEG heterostructure 203 from the adsorbate electronic effect caused by ionic contaminants, whereas thinner layers of SiNx may not provide the desired isolation. In exemplary embodiments, the thickness of the treatment layer 201 may be approximately 4 times the thickness of layers 208, 206, and 210 of FIGS. 2A, 2B, 2C, and 2D. Different treatment layer materials or treatment methods used in alternate exemplary embodiments may require more or less treatment layer thickness to prevent surface contamination (ionic contaminants) from electronically affecting the 2DEG layer of the heterostructure beneath the treatment layer. In other exemplary embodiments, other treatments may be used to prevent surfaces of the magnetic field sensor from being affected by ionic contaminants. As was noted herein, another example, without limitation, of such a treatment is the hermetic sealing of the magnetic field sensor.

In various exemplary embodiments, a low bandgap semiconductor comprises GaN with a bandgap of 3.4 electron volts (eV), intermediate bandgap comprises AlGaN with a bandgap of 3.8 eV, and high bandgap semiconductor comprises AlN with a bandgap of 6 eV. These materials and bandgaps are exemplary and other material may be used where the bandgaps of the materials have low-intermediate-high bandgap relationships similar to the semiconductor materials listed herein.

In other applications, the impact on a 2DEG heterostructure due to ionic contaminant adsorption is utilized for substance sensors that provide information about a gas or liquid substance in contact with an exterior surface of a 2DEG heterostructure. The operation of these substance sensors is dependent on the total ionic contaminant adsorption that is present near the 2DEG layer of the heterostructure, where the adsorption is used to measure the characteristics of the gas or liquid and thus, is desirable in the case of functionalized gas or liquid sensors.

However, for magnetic field sensors, not only is the total ionic contaminant adsorption important from the standpoint of sensor accuracy, the spatial distribution of those ionic contaminants is also important. For example, an asymmetric distribution of ionic contaminants near the 2DEG layer of a magnetic field sensor comprising a III-N 2DEG heterostructure can introduce changes in the distribution of current in the active area of the magnetic field sensor. These changes in the distribution of the current may result in an unpredictable change in the offset voltage (e.g., during current spinning). Additionally, the distribution of ionic contaminants near the III-N 2DEG heterostructure of a magnetic field sensor which comprises the III-N 2DEG heterostructure is likely to change with time and with variations in the environment at the heterostructure exterior surface. This temporal variation in the spatial current distribution may cause the offset voltage to vary over time, which results in an unstable magnetic field sensor.

Figures 3A, 3B:
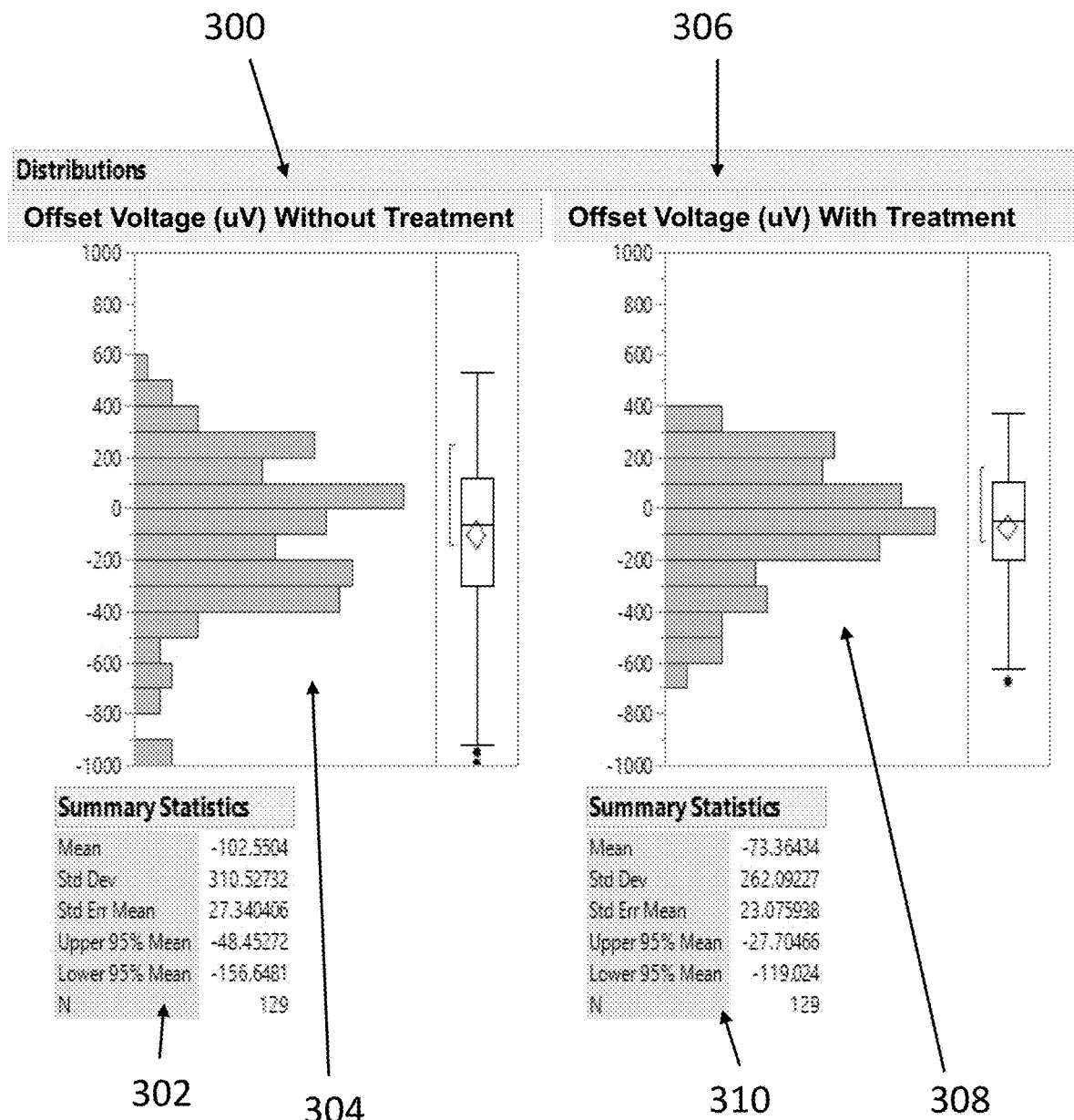
FIG. 3A is an offset voltage distribution chart before application of a treatment layer according to an exemplary embodiment.
FIG. 3B is an offset voltage distribution chart after application of a treatment layer according to an exemplary embodiment.

FIG. 3A illustrates exemplary testing of offset voltage distribution 300 in micro-Volts ($\mu$V) in an exemplary magnetic field sensor comprising a III-N 2DEG heterostructure fabricated without a treatment layer. In the illustrated summary statistics 302, the mean and standard deviation (std dev) are $-102.5511$V and $310.53$ $\mu$V, respectively. As can be seen, the distribution curve of the data is not statistically normal with high levels of samples between $-200$ and $-400$ $\mu$V, shown in area 304. As illustrated in FIG. 3B, the voltage distribution 306 after adding a treatment layer (by the use of an exemplary passivation treatment) exhibits a more statistically normal distribution curve, shown in area 308. In the illustrated summary statistics 310, the mean and standard deviation are reduced to $-73.36$ $\mu$V and $262.09$ $\mu$V, respectively. As can be observed, the majority of the samples are located closer to the $0$ $\mu$V point of the graph which indicates that the effect of ionic contaminants has been reduced. The distribution of offset voltages (the output voltage produced when the magnetic field sensor is subjected to a zero field) for treated magnetic field sensors becomes more normal and the average magnitude of the offset is reduced after passivation. A further indication that offset voltage has been improved (e.g., reduced and normalized) by a treatment layer is the averaged absolute value of measured offset voltage. In the illustrated embodiment, the average of the absolute values of the measure offset voltage of FIG. 3A is $250.38$ $\mu$v while the average absolute values of the measured offset voltage of the treated device of FIG. 3B is $197.66$ $\mu$v. Thus, in the illustrated embodiment, an improvement of approximately 25% has been realized when compared to the non-treated sensor. In other exemplary embodiments an improvement to the resultant offset voltage may range from 0.1% to 100%, including, for example, 5%, 10%, 25%, 50%, 75%, 90%, or 95% of the offset voltage of the non-treated magnetic field sensor.

Light Exclusion

Another form of outside influence is the exposure of a magnetic field sensor to visible or ultraviolet light. In another exemplary embodiment, a method of packaging a magnetic field sensor comprising a III-N 2DEG heterostructure is disclosed such that visible and/or ultraviolet light are excluded from the III-N 2DEG heterostructure components of the magnetic field sensor. This exclusion prevents excitation of defect states, reduces the offset voltage of the magnetic field sensor, and increases the stability of the offset voltage. The improvement also applies to offset voltage calculated during current-spinning operation modes.

Figure 4:
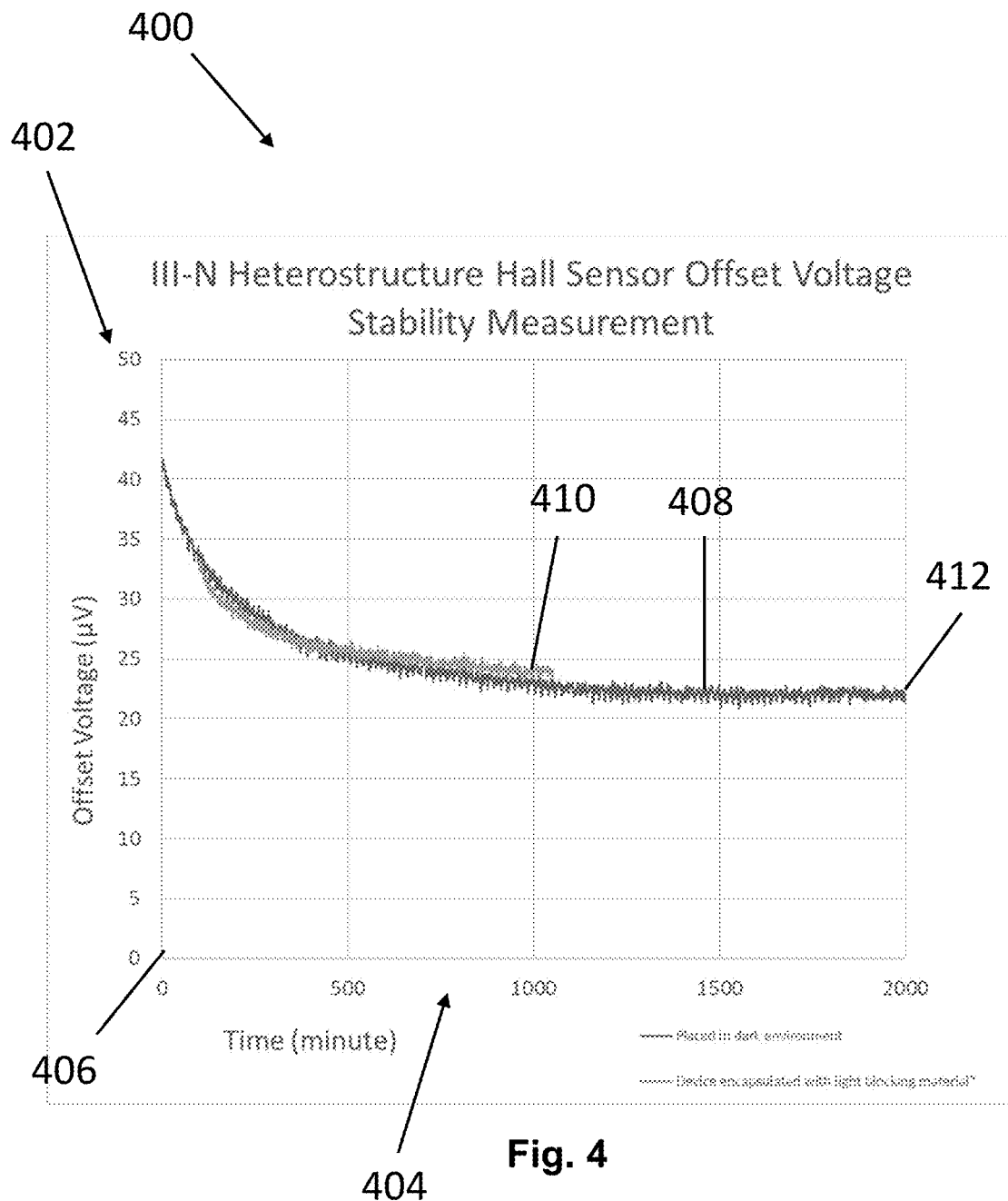
FIG. 4 is graph illustrating the change in offset voltage in an exemplary magnetic field sensor after removal of exposure to light.

The exemplary method of packaging magnetic field sensors and in particular, magnetic field sensors comprising a III-N 2DEG heterostructure described herein results in magnetic field sensors which comprise a III-N 2DEG heterostructure to exhibit lower offset voltages. As illustrated in FIG. 4, exemplary offset voltages change over time after exposure to light, rising with light exposure and then decaying over time after the light exposure is eliminated. Electronic compensation systems can typically only compensate for the stable portion of offset voltages. Thus, electronic compensation can be ineffective when a magnetic field sensor which comprises a III-N 2DEG heterostructure is randomly exposed to light energy.

As was noted herein, localized electrically charged defect states may exist in a heterostructure which forms the active area of a magnetic field sensor. These defect states become electrically charged when excited by a sufficiently large quantum of energy. For example, in a III-N 2DEG heterostructure, this quantum of energy can be provided by a photon of visible or ultraviolet light that impinges the surface of the active area of the heterostructure. Testing indicates that exposing an exemplary embodiment of a magnetic field sensor which comprises a III-N 2DEG heterostructure, such as illustrated in FIG. 1, to light, followed by the removal of the light exposure results in a slowly decreasing offset voltage (when other conditions are held constant). This is illustrated in the offset voltage graph 400 of FIG. 4. As is illustrated the offset voltage 402 approaches an equilibrium offset voltage as the amount of time 404 since removal of light exposure at time zero 406. In the illustrated embodiment, this amount of time is ten hours. As illustrated in the offset voltage graph 400, the result is very similar when the magnetic field sensor is placed in a light-free environment 408 and when the magnetic field sensor is encapsulated in a light blocking material 410. Most significantly, the graph 400 illustrates that the initially higher offset voltage at time zero 406 decays relatively rapidly initially and then slowly approaches an equilibrium offset voltage level 412 Further testing revealed that each time the III-N 2DEG heterostructure of a magnetic field sensor was exposed to light, the offset voltage increased as a result of the phenomenon described above.

Figure 5:
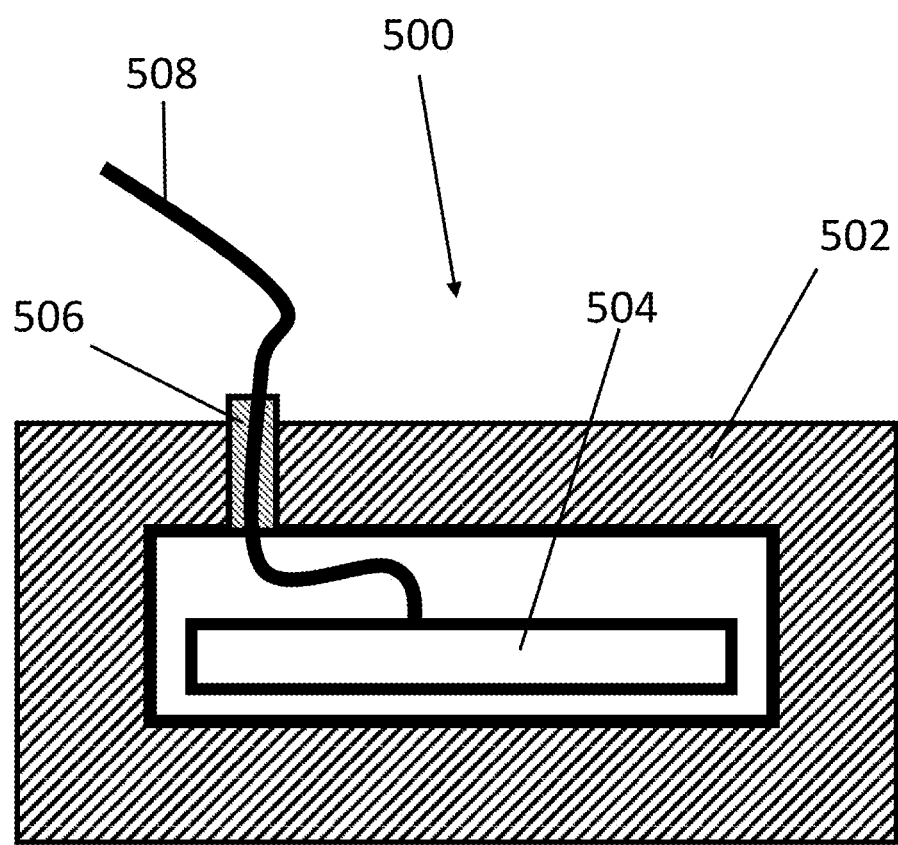
FIG. 5 is a diagram of a magnetic field sensor that has a light blocking or light absorbing cover according to an exemplary embodiment.

In an exemplary embodiment of a magnetic field sensor assembly 500, a cross section of which is shown in FIG. 5, an exemplary covering 502 is applied that excludes visible and ultraviolet light. As is illustrated, the magnetic field sensor 504 (such as is illustrated in FIGS. 1 and 2) is enclosed in the covering 502 with an entry port 506 supplied for electrical connections 508 which provide power and receive measurements from the magnetic field sensor 504. In an exemplary embodiment, this covering 502 blocks or absorbs light in the wavelength range of approximately 80 nanometer (nm) to 800 nm. It will be understood by one of ordinary skill in the art that this range is exemplary and that exclusion of both a more broad or more narrow range will still result in an improvement with regard to offset voltage change over time. For example, wavelengths less than 80 nm and wavelengths greater than 800 nm may be blocked or absorbed. Such exemplary embodiments improve the level of offset voltage and the current spinning analog of offset voltage, the residual voltage, by both stabilizing and reducing the magnitude of offset voltage (or residual voltage in a current spinning configuration). In exemplary embodiments an improvement in offset voltage stability of approximately 38% over a period of 10 hours has been realized when compared to the magnetic field sensor without a covering 502. In other exemplary embodiments the improvement to offset voltage stability may range from 0.1% to 100% including, for example, 5%, 10%, 25%, 38%, 50%, 75%, 90%, or 95%. This reduction allows the measurement of small magnetic fields with greater accuracy.

Referring again to FIG. 5, the magnetic field sensor assembly 500 illustrates a space 510 between the magnetic field sensor 504 and the covering 502 however, in certain embodiments, the covering 502 may enclose the magnetic field sensor 504 with a minimal amount or with no space between the magnetic field sensor 504 and the covering 502.

The entry port 506 may be, but is not limited to, a passageway that allows the electrical connections 508 to pass through the covering 502 without permitting light to enter, an opening that is filled with a sealant, or may be formed by a coating material such as epoxy as described in the following exemplary embodiment.

In some exemplary embodiments, the covering 502 may be an epoxy material. Such an epoxy material may be dyed or impregnated with substances that block or absorb visible and ultraviolet light. Other light blocking or absorbing materials may be used so long as they provide the blocking or absorbing properties corresponding to the wavelengths discussed herein. Other exemplary embodiments include, without limitation, packaging that protects the magnetic field sensor from exposure to light and a process of mounting the magnetic field sensor 504 on a dark substrate such that the dark substrate prevents light from reaching the active area of the sensor.

In other exemplary embodiments, a light blocking or absorbing material as described herein can be applied to magnetic field sensors that comprise III-V compounds (not limited to the subset of III-N compounds) in order to provide the benefits described herein with regard to eliminating the effect on offset voltage resulting from exposure to light.

Insulating Substrate

Figure 6:
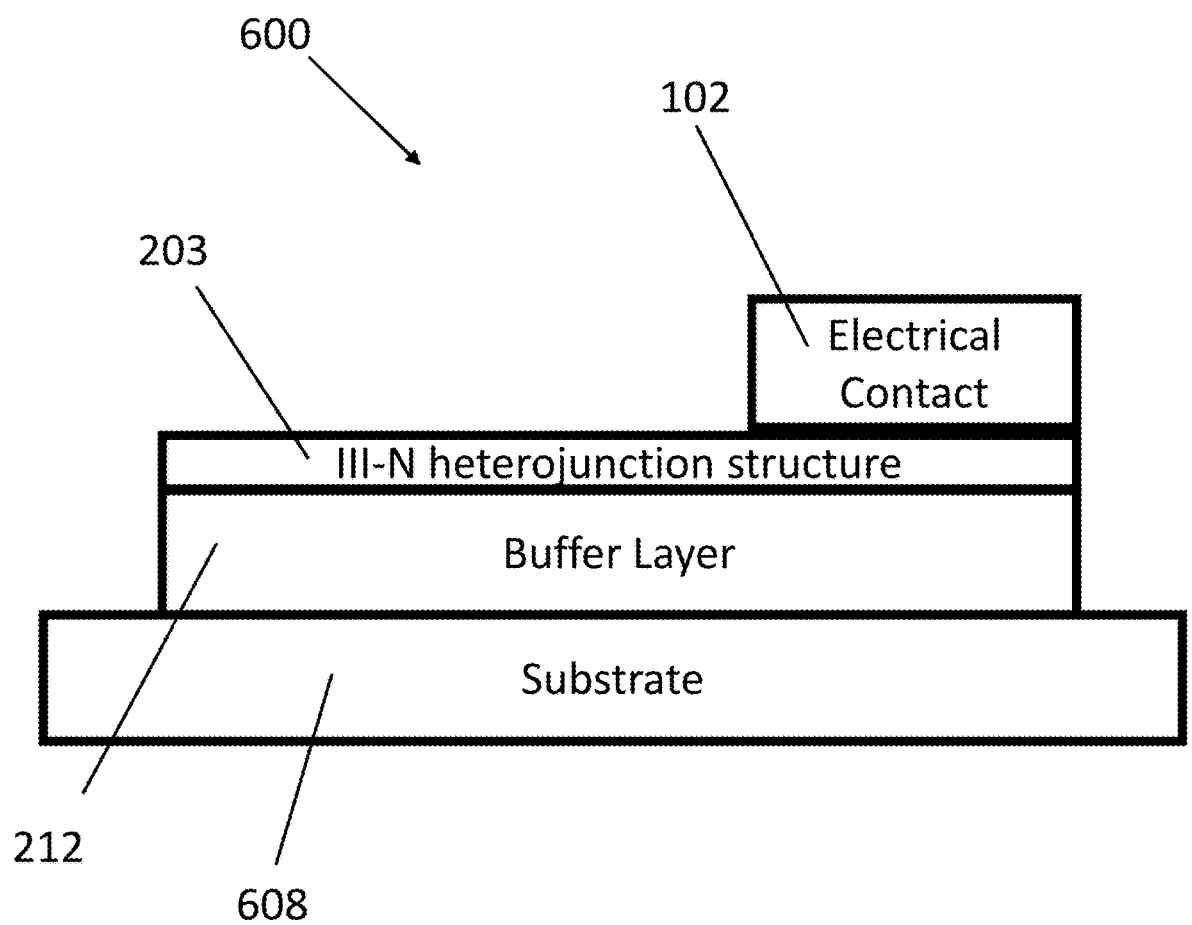
FIG. 6 is a cross section of a magnetic field sensor comprising a high resistance substrate according to an exemplary embodiment.

Another form of outside influence is the exposure of the magnetic field sensor to alternating magnetic fields which can cause eddy currents to form in the sensor. In an exemplary embodiment, a magnetic field sensor which comprises a 2DEG heterostructure is fabricated on top of a protective layer comprising an insulating substrate. In certain exemplary embodiments, the 2DEG heterostructure is a III-V compound, which in certain of these embodiments, the 2DEG heterostructure is a subset of III-V compounds such as III-N. This is illustrated in FIG. 6, which shows a cross section 600 of a portion of a magnetic field sensor comprising a III-N 2DEG heterostructure 203. As illustrated, an electrical contact pad 102 is located at an edge of the III-N 2DEG heterostructure 203 while the opposite edge of the heterostructure adjacent to an optional buffer layer 212 is located on a high resistance substrate 608. Examples of high resistance substrates include sapphire, Si, SiO2, SiC, GaN, GaAs, and alumina. The characteristic of primary importance is that of a low electrical conductivity or high resistivity. Secondary considerations include compatibility with the III-N 2DEG heterostructure 203 materials used in the exemplary embodiment, mechanical stability, and ease of manufacturability. The low electrical conductivity or high resistivity of the substrate serves to prevent or at least inhibit the creation of eddy currents caused by alternating magnetic fields in the area of the substrate. Conductive substrates are subject to eddy currents and thus limit high frequency operation of the magnetic field sensors because eddy currents induced by such alternating magnetic fields can result in measurement errors by the magnetic field sensor which comprises a III-N 2DEG heterostructure 203. Conversely, a high resistance substrate has a low level of conductivity and is less subject to the formation of eddy currents resulting from alternating magnetic fields. The use of a high-resistivity (insulating) substrate results in the high-frequency response of magnetic field sensors comprising a III-N 2DEG heterostructure 203 being less susceptible to eddy current induced errors and thus more predictable and consistent. This allows for more accurate high-frequency magnetic field measurements. For example, exemplary embodiments may provide more accurate measurements than known methods when measuring magnetic fields with frequencies greater than 200 Hz. Other exemplary embodiments may provide improvements at ranges lower than 200 Hz.

Spacer (Confinement) Layer

As noted herein, electronic compensation systems can typically only compensate for a stable portion of offset or residual voltages present in a sensor, including magnetic field sensors comprising a III-N 2DEG heterostructure. Thus, improvements to such magnetic field sensors that reduce their susceptibility to outside influences and their susceptibility to semiconductor device characteristics combined with electronic compensation systems can produce sensors that exhibit improvement in performance over conventional sensors. An exemplary embodiment of such an improved sensor is a magnetic field sensor comprising a III-N 2DEG heterostructure 203 which includes a protection layer in the form of a spacer layer, also known as a confinement layer. The confinement layer helps to minimize offset voltage and residual voltage. The mechanism for this effect is a reduction in asymmetric scattering of electrons by scattering centers in the intermediate bandgap material, identified as 206 in FIG. 2A.

As shown in the cross-section of FIG. 2B, an exemplary embodiment of a magnetic field sensor comprising a III-N 2DEG heterostructure 2002 comprises a layer stack which is further comprised of a first low bandgap III-N layer 204 in which the 2DEG exists formed from Gallium Nitride (GaN), an intermediate bandgap III-N layer 206 formed from Aluminum Gallium Nitride (AlGaN), and an optional second low bandgap layer 210 which is in contact with a spiking electrical contact pad 102 that penetrates down to the first low bandgap III-N layer 204. In the illustrated layer stack, a highest bandgap III-N layer 208, formed from Aluminum Nitride (AlN) which forms the confinement layer, is positioned between the first low bandgap III-N layer 204 and the intermediate bandgap III-N layer 206. This arrangement results in a magnetic field sensor 2002 comprising a III-N 2DEG heterostructure 203 that has lower offset and residual voltages than those without the highest bandgap III-N layer 208. In an exemplary embodiment of the magnetic field sensor 2002 comprising a III-N 2DEG heterostructure 203 the substrate 108 may be any such substrate that is appropriate for epitaxial growth, including silicon, sapphire, GaAs, etc. The composition of the buffer layer 212 is dependent on the substrate and the material deposited on it. The selection of such a buffer material is within the understanding of one of ordinary skill in the art. Known embodiments of layer stacks are functional without the highest bandgap III-N layer 208 but can exhibit a larger magnitude of offset voltages than layer stacks which include the highest bandgap III-N layer 208. The optional second low bandgap layer 210 serves as a cap layer. In embodiments with the optional second low bandgap layer 210, the electrical contact pad 102 is positioned such that it maintains electrical contact to the underlying semiconductor materials.

Figure 7:
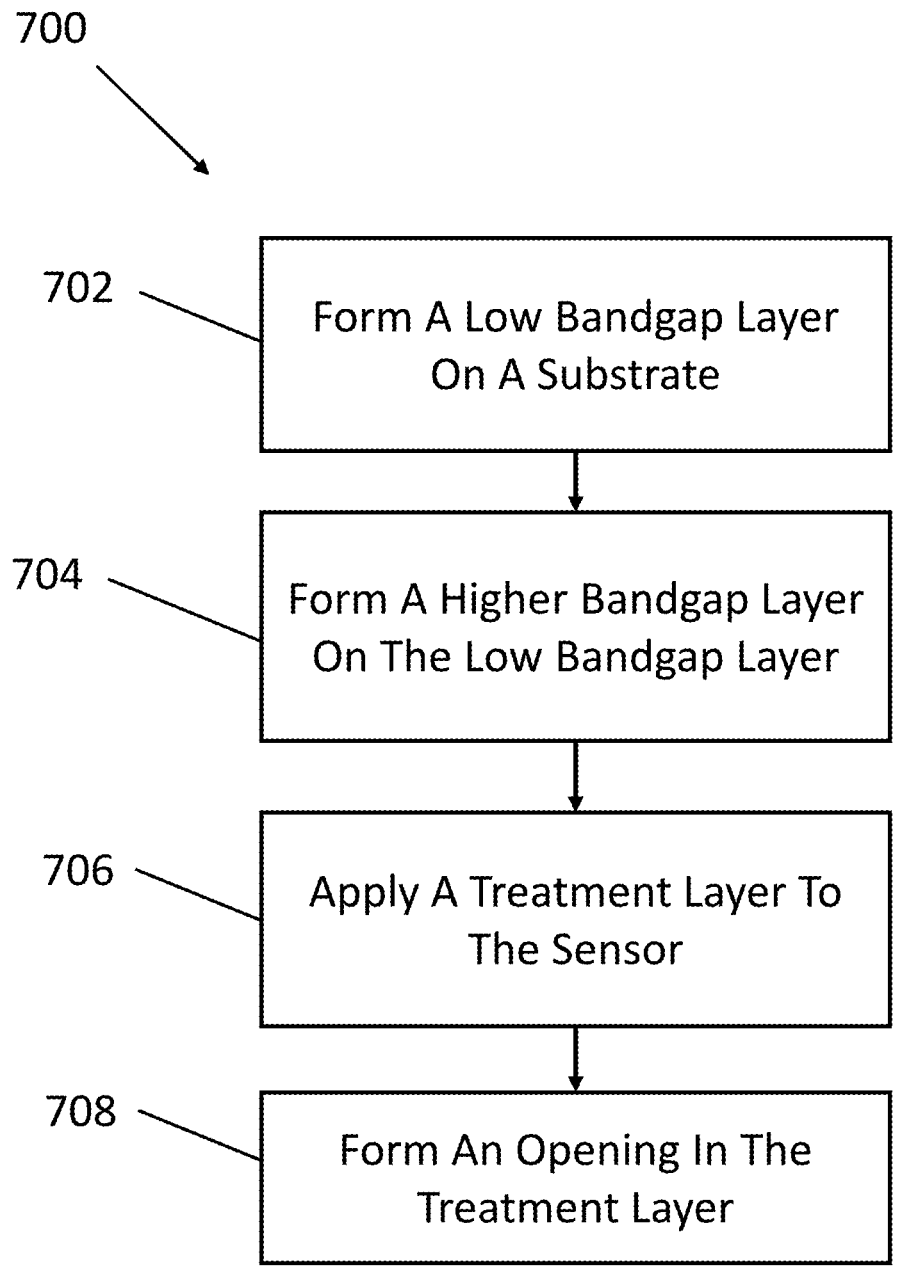
FIG. 7 is a flowchart illustrates the steps of fabricating a magnetic field sensor according to an exemplary embodiment.

The flowchart 700 of FIG. 7 illustrates the steps of fabricating a magnetic field sensor according to an exemplary embodiment. In step 702, a low bandgap layer is formed on a substrate. For example, in an exemplary embodiment, a layer of low bandgap III-N semiconductor materials is formed on the substrate 108. During the formation, masks, etching, other techniques can be used to form the semiconductor materials such that certain layers of a stack formed by the various layers may extent across a majority of the substrate 108, while other layers may form a mesa structure such as the raised mesa structure 104 illustrated in FIG. 1. In step 704, an intermediate bandgap layer is formed on the low bandgap layer. For example, in an exemplary embodiment, an intermediate bandgap III-N semiconductor material is formed on the low bandgap III-N semiconductor. In step 706, a treatment layer 201 is applied or otherwise formed on at least a portion of the magnetic field sensor (see, for example, FIGS. 2A and 2B). As was noted herein, this treatment layer has a thickness sufficient to prevent ionic contaminants from attaching to the III-N 2DEG heterostructure or from otherwise having an adverse effect on the III-N 2DEG heterostructure. In step 708, an opening is formed (by etching or other methods of removing partial portions of a semiconductor) in the treatment layer 201 to allow for the attachment of conductors to the electrical contact pads 102.

Figure 8:
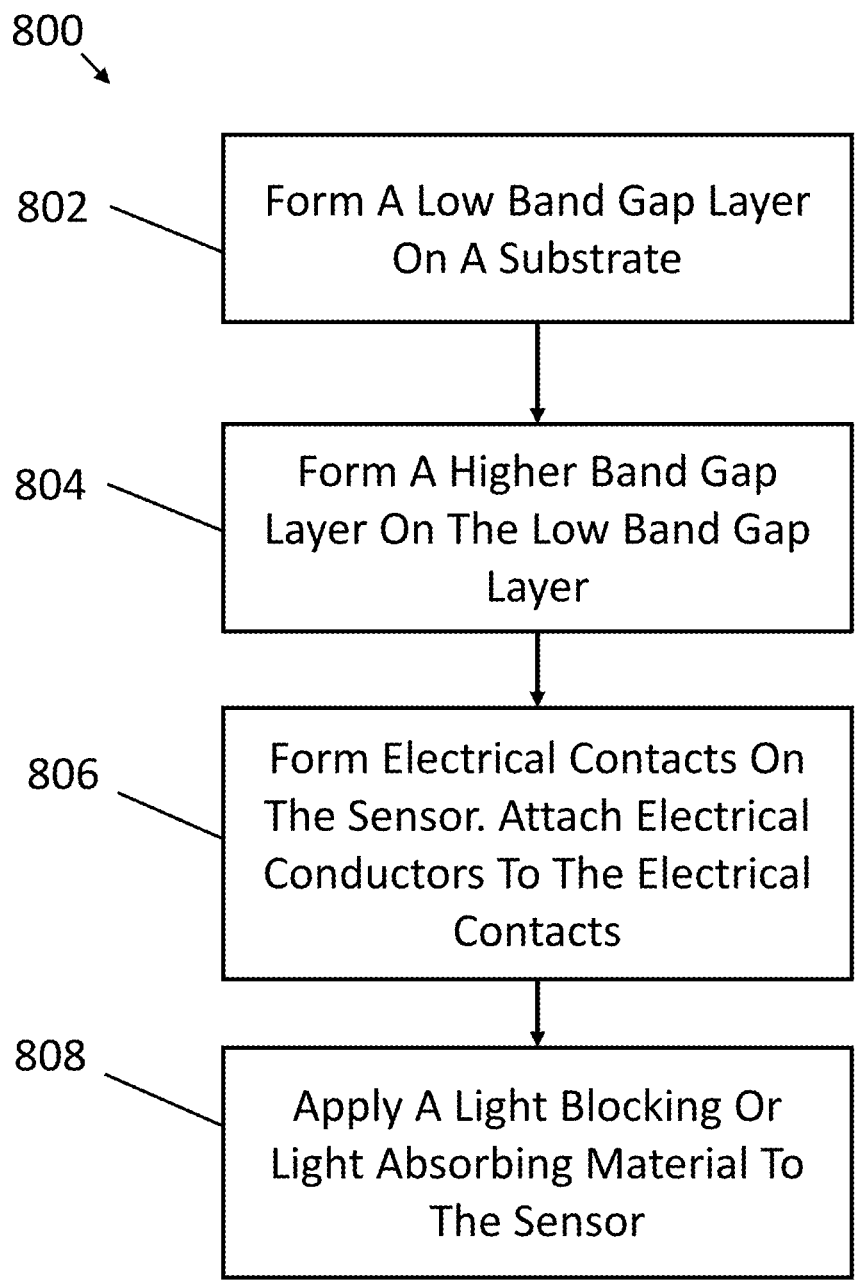
FIG. 8 is a flowchart illustrating the steps of fabricating a magnetic field sensor with a light exclusion material layer applied to the magnetic field sensor according to another exemplary embodiment.

The flowchart 800 of FIG. 8 illustrates the steps of fabricating a magnetic field sensor according to another exemplary embodiment. In step 802, a low bandgap semiconductor layer is formed on a substrate 108. In step 804, a semiconductor layer with a higher bandgap is formed on the low bandgap layer to form a stack of semiconductor layers. In the above steps, the semiconductor layer are III-N materials. However, in other exemplary embodiments, the semiconductor materials used are not limited to III-N materials described herein and may be formed from the larger group of III-V materials as certain of these have demonstrated performance improvements resulting from light exclusion. During the formation, masks, etching, other techniques can be used to form the stack such that certain layers of the stack may extent across a majority of the substrate 108, while other layers may form a mesa structure such as the raised mesa structure 104 illustrated in FIGS. 1 and 2A-2D. In step 806, conductors are attached to electrical contact pads 102 formed on the stack. In step 808 a light blocking, or light absorbing material is applied to the magnetic field sensor (which in an exemplary embodiment is a stack of III-N semiconductor materials formed on a substrate 108). Alternately, the light blocking, or light absorbing material is applied to the substrate 108 in circumstances in which the substrate 108 does not inherently block visible and ultraviolet light. In certain exemplary embodiments, in step 808, the light blocking, or light absorbing material may be an enclosure rather than a material applied to the stack of III-N semiconductor materials formed on a substrate 108. The attachment of conductors in step 806 may not be required in certain embodiments in which the light blocking, or light absorbing material does not interfere with access to the electrical contact pads 102.

Figure 9:
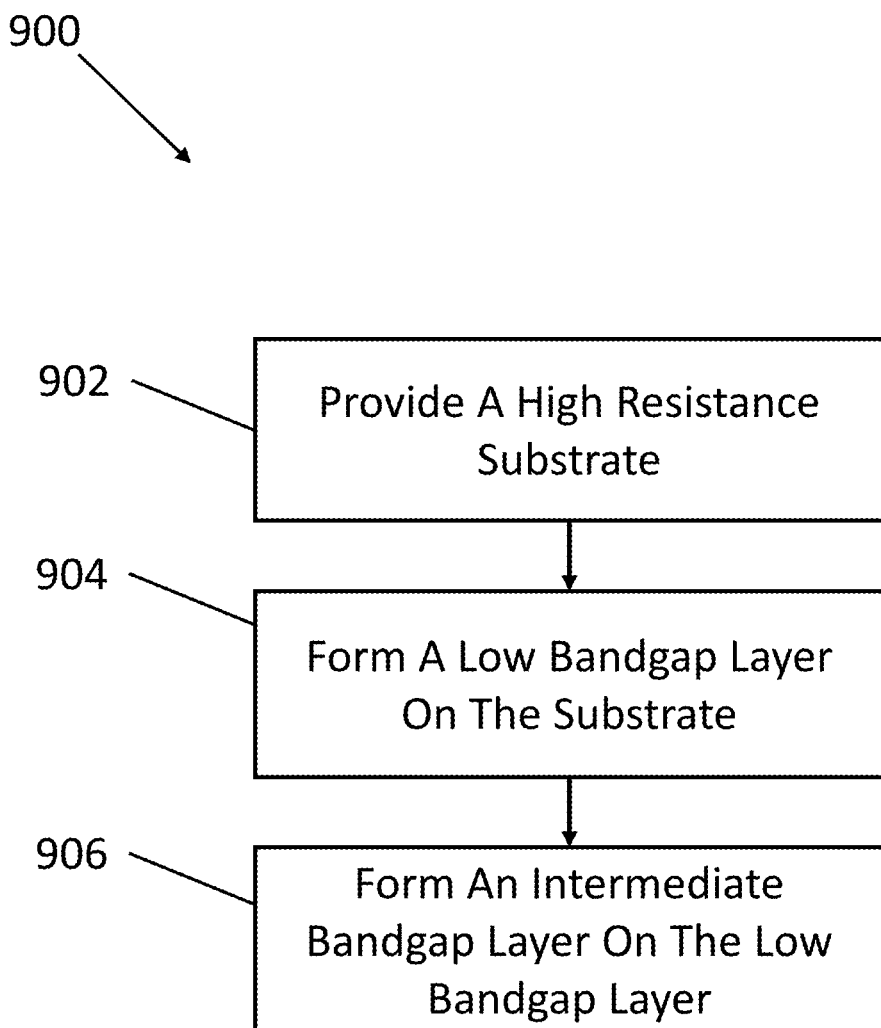
FIG. 9 is a flowchart illustrating the steps of fabricating a magnetic field sensor with a high resistance substrate according to another exemplary embodiment.

The flowchart 900 of FIG. 9 illustrates the steps of fabricating a magnetic field sensor according to an exemplary embodiment. In step 902, a high resistance substrate is provided. In step 904, a low bandgap layer is formed on the substrate 608. In step 906 a layer with an intermediate bandgap is formed on the low bandgap layer to form the stack. In an exemplary embodiment, the low bandgap and the intermediate bandgap layers are formed from III-N semiconductor materials. During the formation of the stack, masks, etching, or other techniques can be used to form the stack such that certain layers of the stack may extend across a majority of the high resistance substrate 608, while other layers may form a mesa structure such as the raised mesa structure 104 illustrated in FIGS. 1 and 2A-2D.

Figure 10:
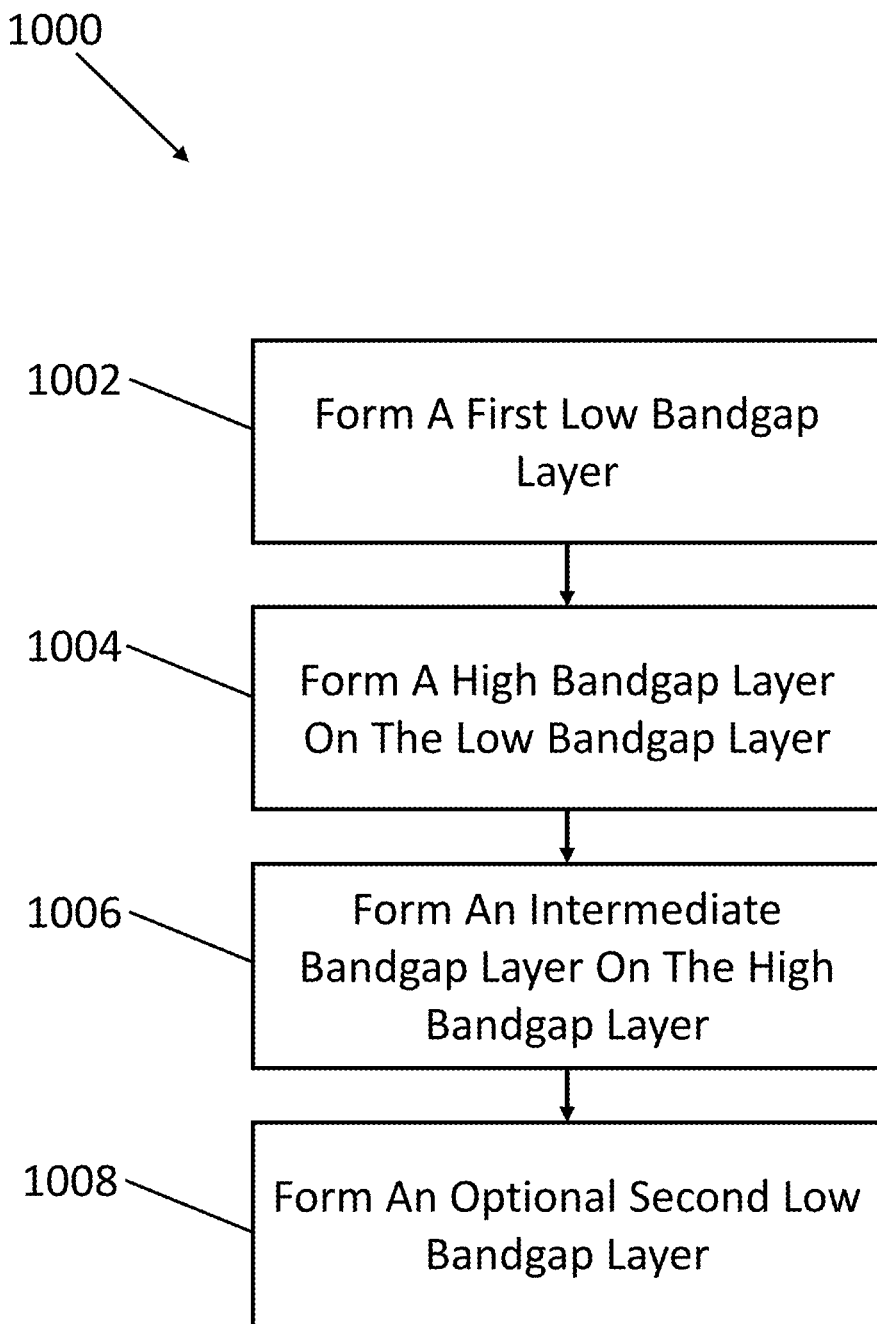
FIG. 10 is a flowchart illustrating the steps of fabricating a magnetic field sensor with a confinement layer according to another exemplary embodiment.

The flowchart 1000 of FIG. 10 illustrates the steps of fabricating a magnetic field sensor according to another exemplary embodiment. During the fabrication process, masks, etching, other techniques can be used to form a semiconductor stack such that certain layers of the stack may extent across a majority of a substrate 108, while other layers may form a mesa structure such as the raised mesa structure 104 illustrated in FIGS. 1 and 2A-2D. In step 1002, a first low bandgap layer is formed. In an exemplary embodiment, the first low bandgap layer is formed from Gallium Nitride (GaN). In step 1004, a high bandgap layer is formed. In an exemplary embodiment, the high bandgap layer is formed from Aluminum Nitride (AlN). This layer forms a confinement layer. In step 1006, an intermediate bandgap layer is formed. In an exemplary embodiment, the intermediate bandgap layer is formed from Aluminum Gallium Nitride (AlGaN). In step 1008, which is optional, a second low bandgap layer is formed. In an exemplary embodiment, the second low bandgap layer is formed from Gallium Nitride (GaN). This exemplary embodiment may be formed with buffer layer and a substrate as illustrated in FIG. 2B.

Figure 11:
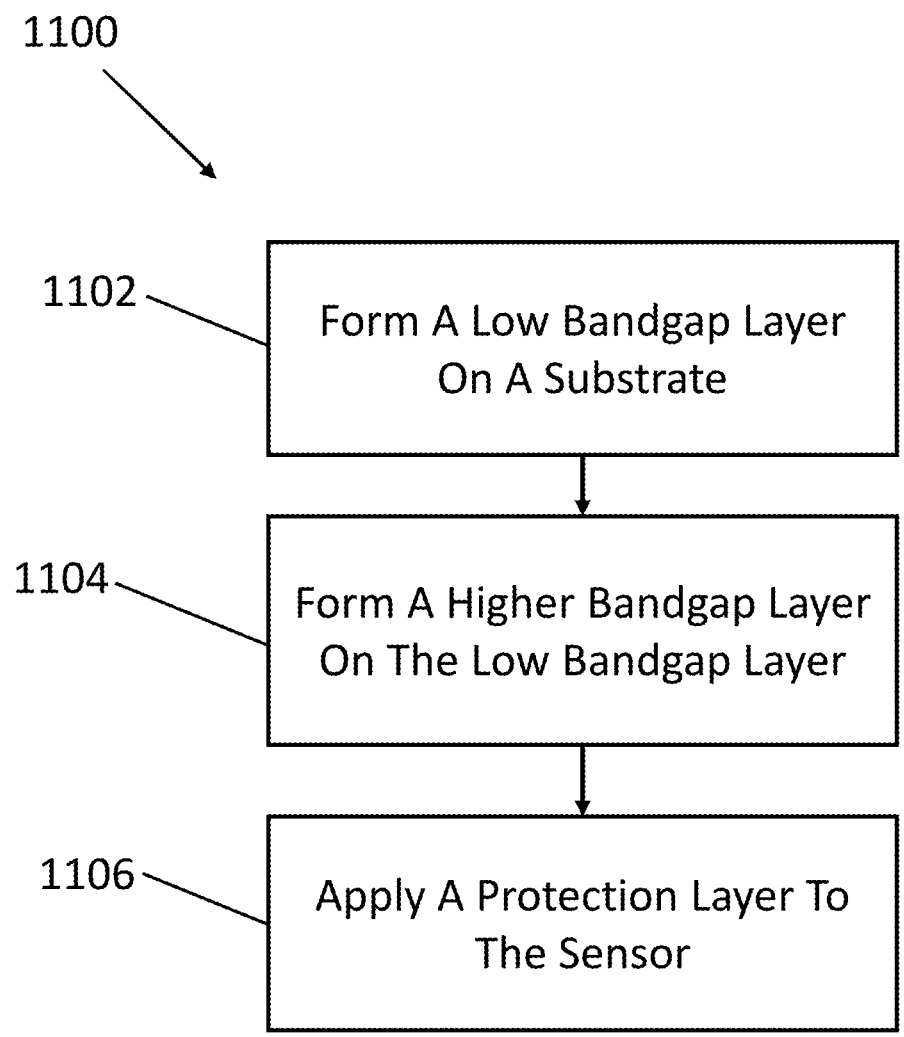
FIG. 11 is a flowchart illustrating the steps of fabricating a magnetic field sensor with a protection layer according to an exemplary embodiment.

The flowchart 1100 of FIG. 11 illustrates the steps of fabricating a magnetic field sensor according to an exemplary embodiment. In step 1102, a low bandgap layer is formed on a substrate. For example, in an exemplary embodiment, a layer of low bandgap III-N semiconductor materials is formed on the substrate. During the formation, masks, etching, other techniques can be used to form the semiconductor materials such that certain layers of a stack formed by the various layers may extent across a majority of the substrate, while other layers may form a mesa structure such as the raised mesa structure 104 illustrated in FIG. 1. In step 1104, an intermediate bandgap layer is formed on the low bandgap layer. For example, in an exemplary embodiment, an intermediate bandgap III-N semiconductor material is formed on the low bandgap III-N semiconductor. In step 1106, a protection layer is applied or otherwise formed on at least a portion of the magnetic field sensor to prevent outside influences from effecting the magnetic field sensor. In some exemplary embodiments, a plurality of protection layers can be added.

In an exemplary embodiment, the method of forming a magnetic field sensor comprises providing a substrate, forming a first low bandgap semiconductor layer comprising a first semiconductor on the substrate, forming an intermediate bandgap semiconductor layer comprising a second semiconductor exhibiting a bandgap that is greater than the first semiconductor, and forming a confinement layer located between the first low bandgap semiconductor layer and the intermediate bandgap semiconductor layer, wherein the confinement layer reduces an asymmetric scattering of electrons.

In another exemplary embodiment, the method of forming a magnetic field sensor further comprises forming a plurality of electrical contacts in electrical communication with a junction of the second semiconductor and the first semiconductor.

In another exemplary embodiment, the method of forming a magnetic field sensor further comprises forming a second low bandgap semiconductor layer on the intermediate bandgap layer.

In exemplary embodiment, the semiconductor layers of a magnetic field sensor are epitaxially grown on the insulating substrate layer.

Although the disclosed technology has been shown and described with respect to a certain aspect, embodiment or embodiments, it is obvious that equivalent alterations and modifications will occur to others skilled in the art upon the reading and understanding of this specification and the annexed drawings. In particular regard to the various functions performed by the above described elements (components, assemblies, devices, members, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary aspect, embodiment or embodiments of the disclosed technology. In addition, while a particular feature of the disclosed technology may have been described above with respect to only one or more of several illustrated aspects or embodiments, such feature may be combined with one or more other features of the other embodiments, as may be desired and advantageous for any given or particular application.

While the embodiments discussed herein have been related to the systems and methods discussed above, these embodiments are intended to be exemplary and are not intended to limit the applicability of these embodiments to only those discussions set forth herein. While the present invention has been illustrated by the description of embodiments thereof, and while the embodiments have been described in some detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and methods, and illustrative examples shown and described. Accordingly, departures may be made from such details without departing from the spirit or scope of the applicant's general inventive concept.

What is claimed is:

1. A magnetic field sensor comprising:
   a first semiconductor layer comprising a first semiconductor;
   a second semiconductor layer comprising a second semiconductor exhibiting a bandgap that is greater than a bandgap of the first semiconductor;
   a third semiconductor layer comprising a third semiconductor;
   a covering that reduces the excitation of defect states caused by the exposure of at least one of the first semiconductor layer and the second semiconductor layer to visible or ultraviolet light.

2. The sensor of claim 1, wherein the covering comprises a material that reflects visible or ultraviolet light.

3. The sensor of claim 1, wherein the covering comprises a material that absorbs visible or ultraviolet light.

4. The sensor of claim 1, wherein the covering reduces the exposure of the semiconductor layers to light with wavelengths in the range of 80 nm to 800 nm.

5. The sensor of claim 1, wherein the first semiconductor comprises gallium nitride, the second semiconductor comprises aluminum gallium nitride, and the third semiconductor comprises aluminum nitride.

6. The sensor of claim 1, wherein a stability of an offset voltage absolute value is improved by at least 38 percent over a period of time of 10 hours when compared to a stability of an offset voltage absolute value over a period of time of 10 hours for the magnetic field sensor without the covering applied to the magnetic field sensor.

7. The sensor of claim 1, further comprising:
   a treatment layer applied to at least a portion of the first semiconductor or the second semiconductor;
   wherein the magnetic field sensor is characterized by an offset voltage absolute value less than an untreated offset voltage absolute value associated with the first low bandgap semiconductor layer and the intermediate bandgap semiconductor layer without the treatment layer, when the magnetic field sensor is exposed to ionic contaminants.

8. The sensor of claim 7, wherein the treatment layer reduces adsorption of ionic contaminants.

9. The sensor of claim 7, wherein the treatment layer is a passivation layer.

10. The sensor of claim 7, wherein the treatment layer is formed from SiNx with a thickness of at least 2 nm.

11. The sensor of claim 7, wherein the first semiconductor comprises gallium nitride and the second semiconductor comprises aluminum gallium nitride.

12. The sensor of claim 7, further comprising:
a high bandgap semiconductor layer comprising a third semiconductor, the third semiconductor exhibiting a greater bandgap than the second semiconductor; and
a second low bandgap semiconductor layer comprising the first semiconductor.

13. The sensor of claim 12, wherein the first semiconductor comprises gallium nitride and the second semiconductor comprises aluminum gallium nitride.

14. The sensor of claim 13, wherein the third semiconductor comprises aluminum nitride.

15. The sensor of claim 7, wherein the offset voltage absolute value is at least 25 percent less than the untreated offset voltage absolute value of the sensor if untreated.

16. A method of forming a magnetic field sensor comprising:
providing a substrate;
forming a first low bandgap semiconductor layer comprising a first semiconductor on the substrate;
forming a second semiconductor layer comprising a second semiconductor exhibiting a bandgap that is greater than the first semiconductor;
forming a third semiconductor layer comprising a third semiconductor exhibiting a bandgap that is greater than the first semiconductor; and
forming a protective layer to the magnetic field sensor.

17. The method of claim 16, wherein the protective layer is a covering applied to the magnetic field sensor that reduces the excitation of defect states found in the magnetic sensor caused by the exposure of the first low bandgap semiconductor layer and the second semiconductor layer to visible or ultraviolet light.

18. The method of claim 17, wherein the covering reduces the exposure of the first low bandgap semiconductor layer, the second semiconductor layer, and the third semiconductor layer to light with wavelengths in the range of 80 nm to 800 nm.

19. The method of claim 16, wherein the protective layer comprises a treatment layer which reduces adsorption of ionic contaminants applied to at least a portion of the first semiconductor or the second semiconductor.

20. The method of claim 19, wherein the treatment layer is formed from SiNx with a thickness of at least 2 nm.

* * * * *